(12) United States Patent
Sakinada et al.

(10) Patent No.: US 8,363,422 B2
(45) Date of Patent: Jan. 29, 2013

(54) ELECTRONIC COMPONENT MODULE AND METHOD FOR MANUFACTURING THE SAME

(75) Inventors: Kaoru Sakinada, Yokohama (JP); Yasuyuki Oda, Yokohama (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 384 days.

(21) Appl. No.: 12/540,721

(22) Filed: Aug. 13, 2009

(65) Prior Publication Data

US 2010/0038122 A1    Feb. 18, 2010

(30) Foreign Application Priority Data

Aug. 13, 2008    (JP) ................................. 2008-208373

(51) Int. Cl.
*H05K 7/14*    (2006.01)
*H05K 7/18*    (2006.01)
(52) U.S. Cl. .................. 361/799; 361/816; 361/728
(58) Field of Classification Search .................. 361/753, 361/799, 800, 816, 818, 735, 728–730, 720, 361/736, 748, 760; 174/521, 377; 257/678–679, 257/777, 778
See application file for complete search history.

(56) References Cited

U.S. PATENT DOCUMENTS

| | | | | |
|---|---|---|---|---|
| 4,673,772 A | * | 6/1987 | Satoh et al. .................... | 174/481 |
| 5,423,080 A | * | 6/1995 | Perret et al. .................... | 455/90.3 |
| 5,883,425 A | | 3/1999 | Kobayashi | |
| 5,990,418 A | * | 11/1999 | Bivona et al. ................... | 174/546 |
| 6,048,433 A | * | 4/2000 | Maesaka et al. ............... | 156/314 |
| 6,117,355 A | * | 9/2000 | Yoshizawa et al. ...... | 252/62.9 R |
| 6,137,693 A | * | 10/2000 | Schwiebert et al. .......... | 361/803 |
| 6,433,412 B2 | * | 8/2002 | Ando et al. .................... | 257/678 |
| 6,483,718 B2 | * | 11/2002 | Hashimoto .................... | 361/803 |
| 6,775,153 B2 | * | 8/2004 | Hashimoto .................... | 361/803 |
| 7,142,435 B2 | * | 11/2006 | Goto et al. ..................... | 361/818 |
| 7,184,276 B2 | * | 2/2007 | Hashimoto .................... | 361/803 |
| 7,282,906 B2 | * | 10/2007 | Coffy ............................. | 361/809 |
| 7,557,307 B2 | * | 7/2009 | Nishizawa et al. ............ | 174/384 |
| 7,608,789 B2 | * | 10/2009 | Kruger et al. .................. | 174/521 |
| 7,643,311 B2 | * | 1/2010 | Coffy ............................. | 361/818 |
| 7,760,034 B2 | * | 7/2010 | Moriya .............................. | 331/68 |
| 7,816,794 B2 | * | 10/2010 | Sakinada et al. .............. | 257/790 |

(Continued)

FOREIGN PATENT DOCUMENTS

| | | |
|---|---|---|
| JP | 03-082144 | 4/1991 |
| JP | 05-206313 | 8/1993 |
| JP | 08-141745 | 6/1996 |

(Continued)

*Primary Examiner* — Hung S Bui
(74) *Attorney, Agent, or Firm* — Chen Yoshimura LLP

(57) ABSTRACT

An electronic component module includes: an insulative substrate; a device chip mounted on a first surface of the insulative substrate in flip-chip mounting; a chip component connected to the insulative substrate; a lid provided above the insulative substrate and the device chip; a first metal pattern that is provided in edge portions on the first surface of the insulative substrate so as to surround the first surface of the insulative substrate; a second metal pattern that is provided in edge portions on a second surface of the lid opposite to the first surface so as to surround the second surface; and seal solder joining the first and second metal patterns so as to define a cavity that is formed in a region that is located between the insulative substrate and the lid and is not provided with the first and second metal patterns and is further formed between the insulative substrate and the device chip.

13 Claims, 10 Drawing Sheets

| U.S. PATENT DOCUMENTS | | | |
|---|---|---|---|
| 7,989,928 B2 * | 8/2011 | Liao et al. | 257/659 |
| 8,031,013 B2 * | 10/2011 | Takeuchi et al. | 331/68 |
| 2002/0044030 A1 | 4/2002 | Uchikoba | |
| 2002/0053127 A1 | 5/2002 | Uchikoba | |
| 2007/0107177 A1 * | 5/2007 | Kawachi et al. | 29/25.35 |

| FOREIGN PATENT DOCUMENTS | | |
|---|---|---|
| JP | 09-130009 | 5/1997 |
| JP | 2002-076832 A | 3/2002 |
| JP | 2002-084155 A | 3/2002 |

* cited by examiner

US 8,363,422 B2

ELECTRONIC COMPONENT MODULE AND METHOD FOR MANUFACTURING THE SAME

CROSS-REFERENCE TO RELATED APPLICATION

This application is based upon and claims the benefit of priority of the prior Japanese Patent Application No. 2008-208373, filed on Aug. 13, 2008, the entire contents of which are incorporated herein by reference.

FIELD

A certain aspect of the embodiments discussed herein is related to an electronic component module and a method for manufacturing the same.

BACKGROUND

Flip-chip mounting is frequently employed in terms of recent demands for downsizing and cost reduction. The flip-chip mounting uses bumps to connect a device chip and a substrate. In some cases, chip components such as inductors and capacitors are additionally connected to the substrate to form electronic components as a module, so that the integration density can be improved.

Electronic component modules as described above have a problem that the functions of the device chips may be damaged due to external shock, adhesion of foreign particles, and entering water. Particularly, in a case where the device chip includes a surface acoustic wave (SAW) device or a film-bulk acoustic resonator (FBAR), the performance may be changed adversely. A specific technique of sealing and protecting the device chips is used to suppress the above problem.

Japanese Laid-Open Patent Publication Nos. 2002-76832 and 2002-84155 disclose arrangements in which acoustic wave devices and surface mounting components are mounted on a multilayer substrate, and each of the parts is sealed with sidewalls and a lid.

SUMMARY

According to an aspect of the present invention, there is provided an electronic component module includes: an insulative substrate; a device chip mounted on a first surface of the insulative substrate in flip-chip mounting; a chip component connected to the insulative substrate; a lid provided above the insulative substrate and the device chip; a first metal pattern that is provided in edge portions on the first surface of the insulative substrate so as to surround the first surface of the insulative substrate; a second metal pattern that is provided in edge portions on a second surface of the lid opposite to the first surface so as to surround the second surface; and seal solder joining the first and second metal patterns so as to define a cavity that is formed in a region that is located between the insulative substrate and the lid and is not provided with the first and second metal patterns and is further formed between the insulative substrate and the device chip.

According to another aspect of the present invention, there is provided a method for manufacturing an electronic component module including: mounting a device chip on a first surface of an insulative substrate in flip-chip mounting; connecting the insulative substrate and a chip component; and joining, with seal solder, a first metal pattern that is provided in edge portions on the first surface of the insulative substrate so as to surround the first surface of the insulative substrate, and a second metal pattern that is provided in edge portions on a second surface of the lid opposite to the first surface so as to surround the second surface so as to define a cavity that is formed in a region that is located between the insulative substrate and the lid and is not provided with the first and second metal patterns and is further formed between the insulative substrate and the device chip.

DESCRIPTION OF EMBODIMENTS

A description will now be given of related art. FIG. 1 is a cross-sectional view of an electronic component module as disclosed in Japanese Laid-Open Patent Publication No. 2002-76832, and FIG. 2 is a cross-sectional view of an electronic component module as disclosed in Japanese Laid-Open Patent Publication No. 2002-84155.

Figure 1A:
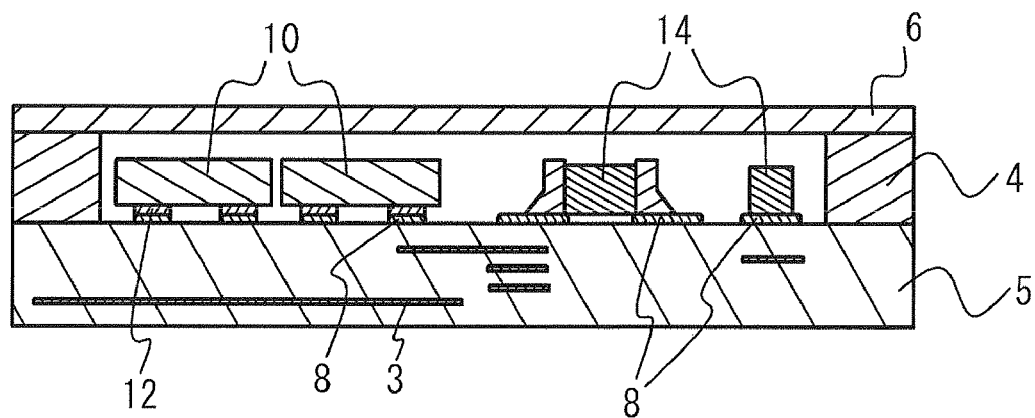
FIG. 1A is a cross-sectional view of an electronic component module according to a related art.
Figure 1B:
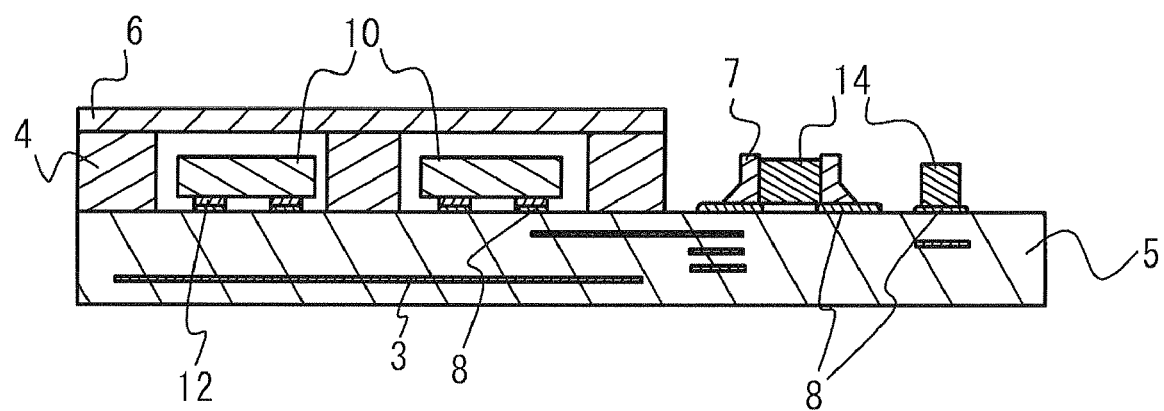
FIG. 1B is a cross-sectional view of an electronic component module according to another related art.

Referring to FIG. 1A, SAW device chips 10 are connected to electrodes 8 formed on an upper surface of a ceramic multilayer substrate 5 including inner conductor layers 3 by using bumps 12. In other words, the SAW device chips 10 are flip-chip mounted on the upper surface of the ceramic multilayer structure 5. Chip components 14 are connected to the electrodes 8 by solder 7. The SAW device chips 10 and the chip components 14 are sealed with sidewalls 4 made of resin and a lid 6 made of resin. Referring to FIG. 1B, each of the device chips 10 is individually sealed with the sidewalls 4 and the lid 6, and the chip components 14 are not sealed.

The electronic component modules illustrated in FIGS. 1A and 1B do not realize good hermetic seal because of the use of resin for the sidewalls 4 and the lid 6.

According to an aspect of embodiments, there are provided an electronic component module having improved hermetic seal, and a method for manufacturing the same.

Embodiments of the present invention will now be described with reference to the accompanying drawings.

First Embodiment

Figure 2A:
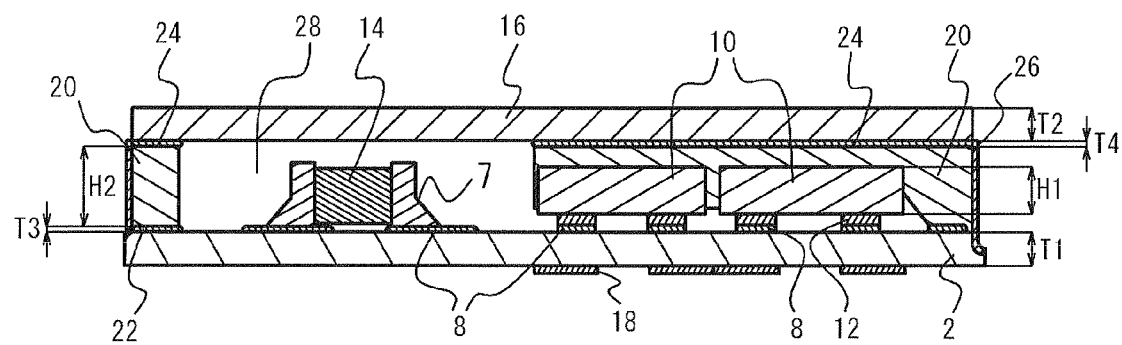
FIG. 2A is a cross-sectional view of an electronic component module according to a first embodiment.
Figure 2B:
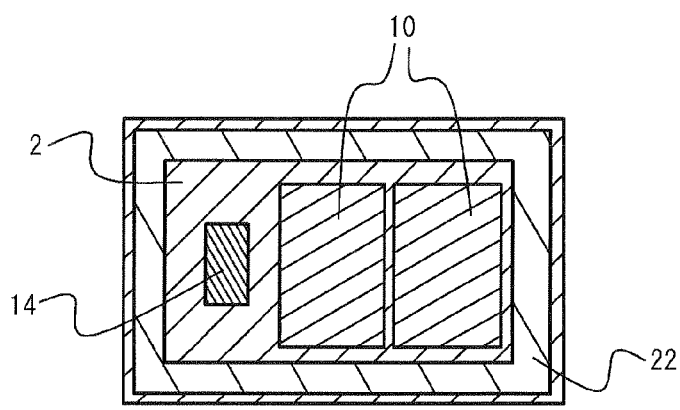
FIG. 2B is a plan view of an insulative substrate used in the electronic component module illustrated in FIG. 2A.
Figure 2C:
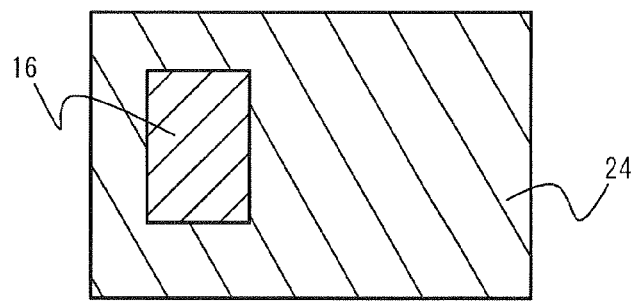
FIG. 2C is a bottom view of a lid used in the electronic component module illustrated in FIG. 2A.

FIG. 2A is a cross-sectional view of an electronic component module in accordance with a first embodiment, FIG. 2B is a plan view of an insulative substrate, ad FIG. 2C is a bottom view of a lid. For the sake of simplicity, these figures are not depicted at the same scale.

As illustrated in FIG. 2A, the electronic component module includes an insulative substrate 2, which is made of an insulative material such as high temperature fired ceramic (HTC) containing alumina as a major component and has a thickness T1 of, for example 0.2 mm. Electrodes 8, which are made of A1, are provided on an upper surface of the insulative substrate 2. Two SAW device chips 10 are connected to the electrodes 8 by bumps 12, which may be made of a metal such as Au. That is, the two SAW device chips 10 are flip-chip mounted on the upper surface of the insulative substrate 2. The SAW device chips 10 have a height H1 of, for example, 0.2-0.3 mm. A chip component 14 is connected to the corresponding electrodes 8 by solder 7 made of, for example, Sn—Ag. That is, the chip component 14 is flip-chip mounted on the upper surface of the insulative substrate 2. The chip component 14 has a height H2 of, for example, 0.2-0.3 mm. The electrodes 8 are electrically connected to terminals 18 provided on a lower surface of the insulative substrate 2, and are made of a metal, which may include W, Ni and Au. A lid 16 is provided above the insulative substrate 2, the SAW device chips 10 and the chip component 14. The lid 16 may be made of an insulator such as high temperature fired ceramic containing alumina as a major component, and has a thickness T2 of, for example, 0.2-0.4 mm.

As illustrated in FIGS. 2B and 2C, a first metal pattern 22 is formed in edge portions on the upper surface of the insulative substrate 2 so as to surround the upper surface thereof. The first metal pattern 22 may be made of a metal such as Au and a thickness T3 of 1-30 μm.

As illustrated in FIGS. 2C and 2A, a second metal pattern 24 is provided on a surface (lower surface) of the lid 16 that faces the insulative substrate 2. The second metal pattern 24 is provided so as to surround the lower face of the insulative substrate 2 and overlap the SAW device chips 10. The second metal pattern 24 may be made of a metal such as Au, and has a thickness T4 of, for example, 1-30 μm. The second metal pattern 24 is not provided to an area on the lower surface of the lid 16 that faces the chip component 14. A height H3 between the upper surface of the SAW device chips 10 and the second metal pattern 24 is equal to, for example, 0.1 mm or less.

As illustrated in FIG. 2A, the first metal pattern 22 and the second metal pattern 24 are joined by seal solder 20, which may be made of, for example, Sn—Ag. That is, the SAW device chips 10 and the chip component 14 are sealed by the lid 16 and the seal solder 20. A cavities 28 is defined between the insulative substrate 2 and the SAW device chips 10 and is defined in a region that is located between the insulative substrate 2 and the lid 16 and is not provided with the first metal pattern 22 and the second metal pattern 24. That is, the cavity 28 is defined between the chip component 14 and the SAW device chips 10 and is defined between the chip component 14 and the seal solder 20.

A description will now be given of a method for manufacturing the electronic component module in accordance with the first embodiment. FIGS. 3A through 3D and FIGS. 4A and 4B are cross-sectional views illustrating a method for manufacturing the electronic component module in accordance with the first embodiment.

Figure 3A:
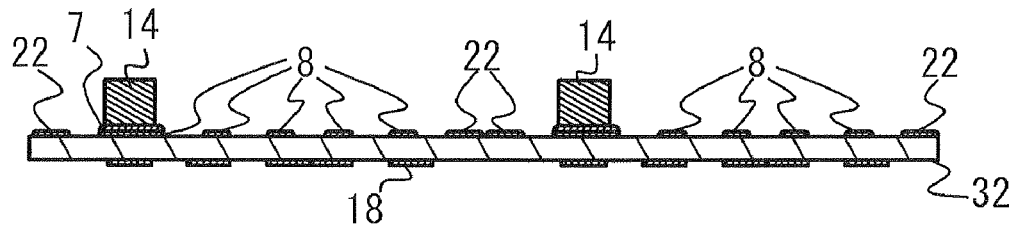
FIGS. 3A through 3D are cross-sectional views illustrating a method for manufacturing the electronic component module in accordance with the first embodiment.

As illustrated in FIG. 3A, solder 7 is provided on the electrodes 8 formed on the upper surface of an insulative substrate 32 of a panel structure by printing, and the chip components 14 are connected to the electrodes 8. That is, the chip components 14 are flip-chip mounted on the insulative substrate 32 by using the surface mounting technique.

Figure 3B:
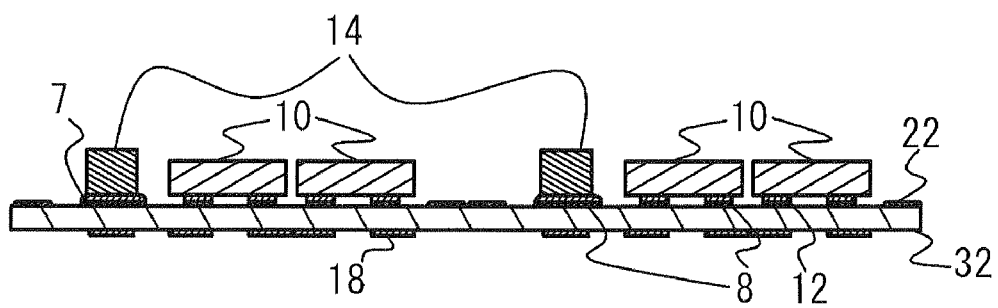

Referring to FIG. 3B, the SAW device chips 10 are flip-chip mounted on the upper surface of the insulative substrate 32 by using the bumps 12.

Figure 3C:
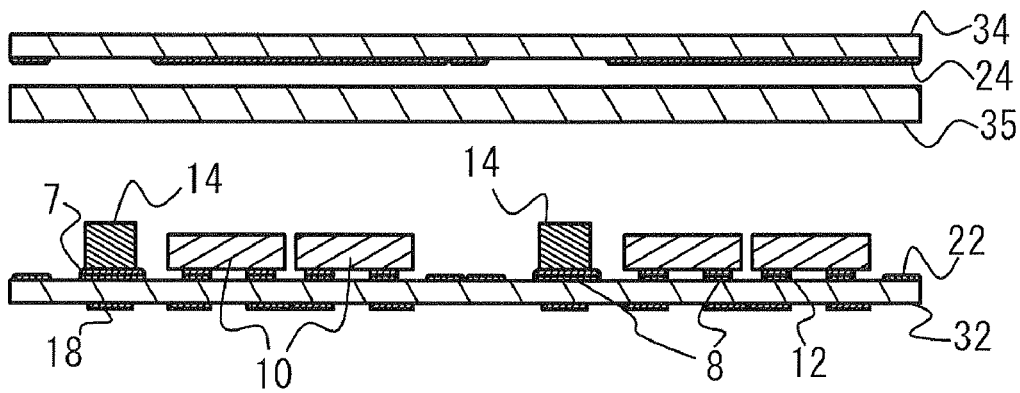

Referring to FIG. 3C, a solder sheet 35 and the lid 34 are arranged on or above the insulative substrate 32, the SAW device chips 10 and the chip components 14. The solder sheet 35 is arranged between the insulative substrate 32 and the lid 34.

Figure 3D:
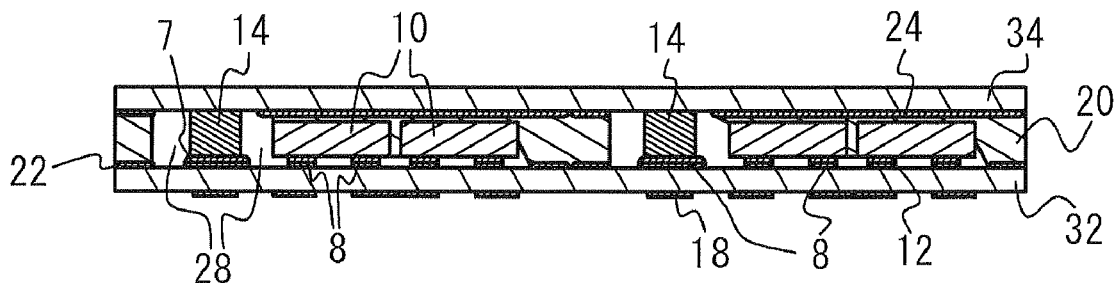

Referring to FIG. 3D, the solder sheet 35 is heated and pressurized so that the melted solder sheet 35 flows along the first metal pattern 22 provided on the upper surface of the insulative substrate 32 and the second metal pattern 24 provided on the lower surface of the lid 34. When the melted solder is hardened, the first metal pattern 22 and the second metal pattern 24 are joined by the seal solder 20. That is, the SAW device chips 10 and the chip components 14 are sealed with the lid 34 and the seal solder 20. The cavity 28 is defined in a region that is located between the insulative substrate 32 and the lid 34 and is not provided with the first metal pattern 22 and the second metal pattern 24 and is further formed between the insulative substrate 32 and the SAW device chips 10.

Figure 4A:
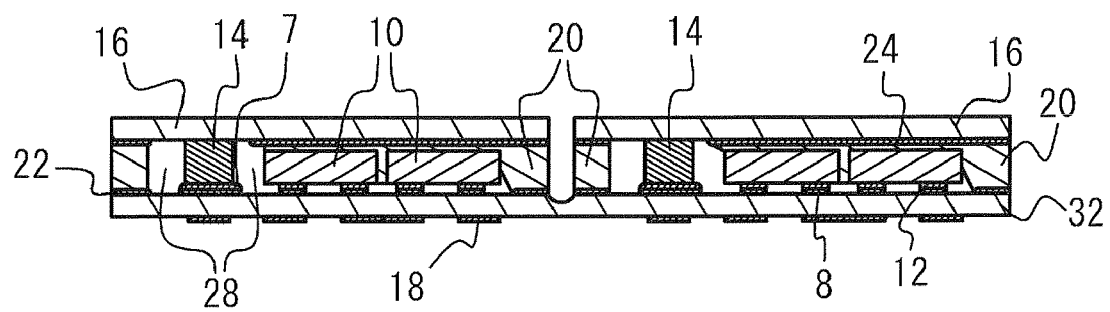
FIGS. 4A and 4B are cross-sectional views illustrating a method for manufacturing the electronic component module in accordance with the first embodiment, in which the processes in FIGS. 4A and 4B follow the processes illustrated in FIGS. 3A through 3D.

As illustrated in FIG. 4A, the lid 16 and the seal solder 20 are cut by dicing. In this dicing, the insulative substrate 32 is not cut.

Figure 4B:
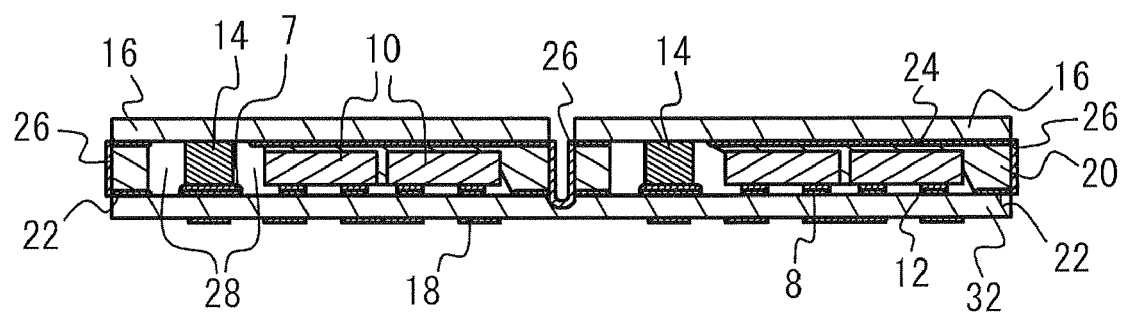

Referring to FIG. 4B, a metal film 26 made of, for example, Ni is formed on the surface of the seal solder 20 by electroless plating or electrolytic plating. After that, the insulative substrate 32 is cut, so that the electronic component modules as illustrated in FIG. 2A can be completed.

According to the first embodiment, the melted solder flows along the first metal pattern 22 and the second metal pattern 24, and joins the patterns 22 and 24 together. It is thus possible to realize the electronic component module having hermetic seal more reliable than the sealing with resin and to maintain the moisture resistance at MSL1.

As illustrated in FIG. 2A, the cavity 28 is defined between the chip component 14 and the SAW device chips 10 and is between the chip component 14 and the seal solder 20. That is, the chip component 14 and the seal solder 20 are isolated from each other. Similarly, the SAW device chips 10 and the seal solder 20 are isolated from each other. It is thus possible to operate the SAW device chips 10 and the chip component 14 separately. Thus, the chip component may be used to form a matching circuit and may be mounted together with the SAW device chips 10. It is thus possible to realize a less-expensive highly hermetic duplexer using the insulative substrate 2 made of less-expensive high temperature fired ceramic.

Sealing with the seal solder 20 is realized with the second metal pattern 24 being provided so as to surround the lower surface of the lid 16. The second metal pattern 24 is provided so as to overlap the SAW device chips 10, and the seal solder 20 covers the upper surfaces of the SAW device chips 10. Thus, the second metal pattern 24 and the seal solder 20 function as a shield that blocks electrical noise from the outside of the electronic component module. Further, the seal solder 20 depresses the SAW device chips 10 from the upper sides thereof, the strength of the junction between the insulative substrate 2 and the SAW device chips 10 can be improved. It is thus preferable to arrange the second metal pattern 24 so as to overlap the SAW devices 10.

The bumps 12 are not limited to Au. As illustrated in FIGS. 3B through 3D, the seal step of heating the solder sheet 35 is carried out after the step of flip-chip mounting the SAW device chips 10. It is thus preferable to form the bumps with a metal having a higher melting point than that of solder of the solder sheet 35. The first metal pattern 22 and the second metal pattern 24 are not limited to Au but may be made of another metal having good wetting to the seal solder 20.

The metal film 26 may be omitted. However, the metal film 26 functions to improve the mechanical strength.

Second Embodiment

Figure 5A:
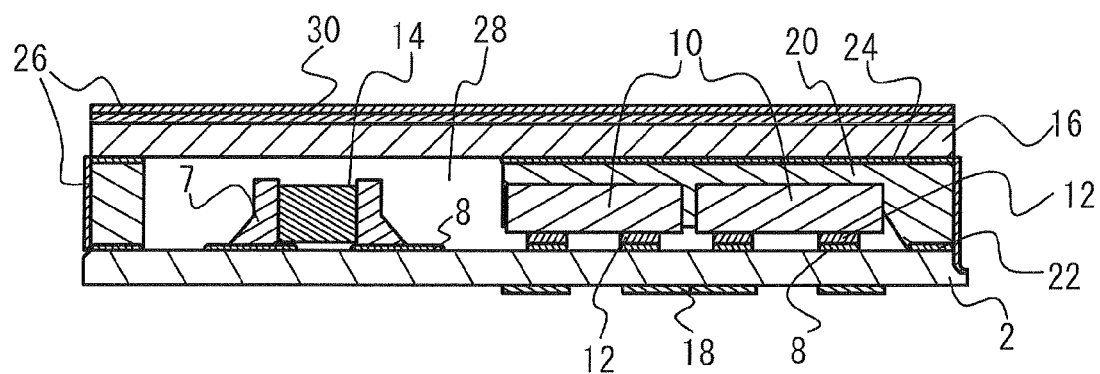
FIGS. 5A and 5B are cross-sectional views of an electronic component module in accordance with a second embodiment.
Figure 5B:
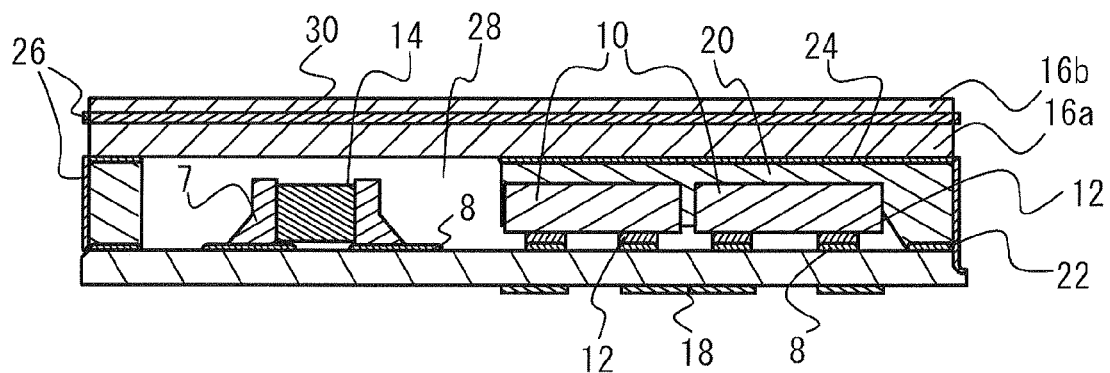

A second embodiment has an exemplary structure in which a shield pattern is provided to the lid 16. FIGS. 5A and 5B are respectively cross-sectional views of an electronic component module in accordance with the second embodiment. In FIGS. 5A and 5B, the same structure as that of the first embodiment will not be described in detail below in order to avoid the redundancy.

As illustrated in FIG. 5A, a shield pattern 30, which may be made of a metal such as W+Ni+Au, is provided on the upper surface of the lid 16. A metal film 26 is formed on the shield pattern 30 by plating.

As illustrated in FIG. 5B, the lid 16 is composed of multiple layers 16a and 16b, each of which may be made of, for example, high temperature fired ceramic.

According to the second embodiment, the use of the shield pattern 30 improves the effect of shielding electrical noise.

Third Embodiment

Figure 6A:
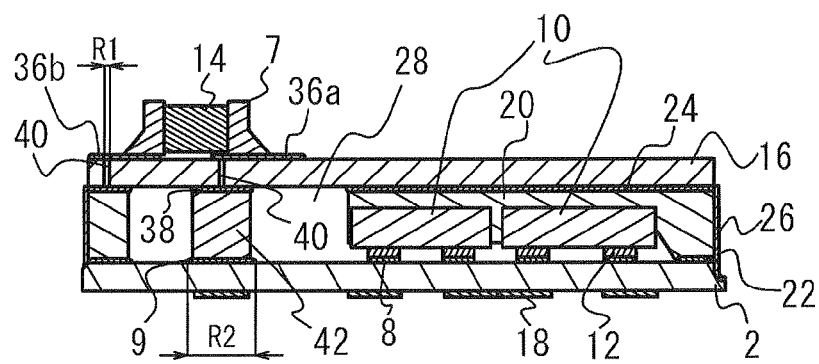
FIG. 6A is a cross-sectional view of an electronic component module in accordance with a third embodiment.
Figure 6B:
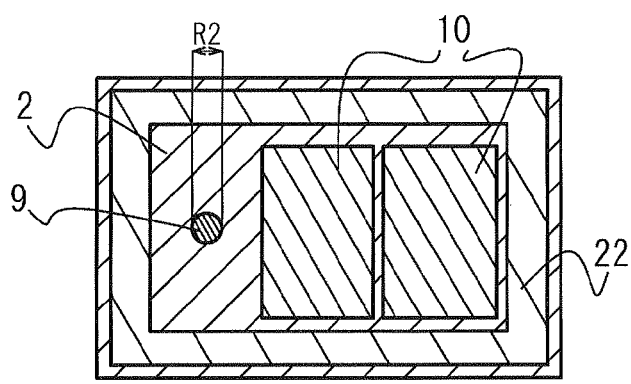
FIG. 6B is a plan view of an insulative substrate employed in the module in FIG. 6A.
Figure 6C:
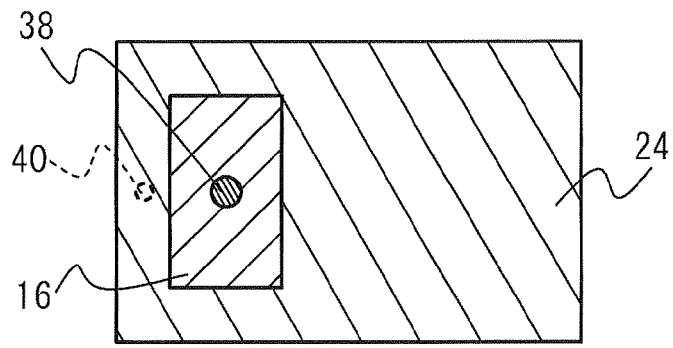
FIG. 6C is a bottom view of a lid employed in the module in FIG. 6A.

A third embodiment has an exemplary structure in which a chip component is mounted on the upper surface of the lid. FIG. 6A is a cross-sectional view of an electronic component module in accordance with the third embodiment, and FIG. 6B is a plan view of an insulative substrate employed in the third embodiment. FIG. 6C is a bottom view of a lid used employed in the third embodiment, and FIG. 6D is a plan view of the lid.

Figure 6D:
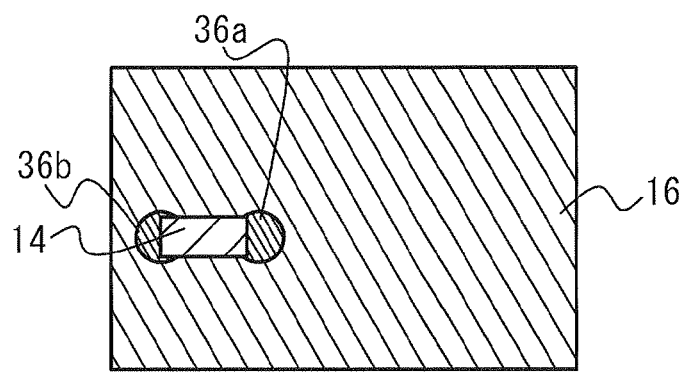
FIG. 6D is a plan view of the lid.

As illustrated in FIGS. 6A and 6D, one chip component 14 is connected, by solder 7, to electrodes 36a and 36b formed on the upper surface of the lid 16 opposite to the lower surface thereof that faces the insulative substrate 2. The electrodes 36a and 36b may be made of a metal such as W+Ni+Au. In other words, the chip component 14 is flip-chip mounted on the upper surface of the lid 16.

As illustrated in FIG. 6B, an electrode 9 is provided on the upper surface of the insulative substrate 2. The electrode 9 may be made of a metal such as W+Ni+Au. As illustrated in FIG. 6C, an electrode 38 is provided on the lower surface of the lid 16 and is isolated from the second metal pattern 24. The electrode 38 may be made of a metal such as W+Ni+Au.

A via 40 pierces the lid 16 and connects the electrode 36a provided on the upper surface of the lid 16 and the electrode 38 provided on the lower surface thereof. The via 40 has a diameter R1 of, for example, 0.3 mm and is full of a metal such as W or Cu. The electrodes 36a and 9 are connected by an interconnection 42 provided in the cavity 28. The interconnection 42 has a diameter R2 greater than the diameter R1 and is made of, for example, solder such as Sn—Ag. The chip component 14 is thus isolated from the insulative substrate 2. The electrode 36b and the second metal pattern 24 are connected to each other by the via 40. The electrode 36b is thus grounded.

FIGS. 7A through 7D and FIGS. 8A and 8B are cross-sectional views illustrating a method for manufacturing the electronic component module in accordance with the third embodiment.

Figure 7A:
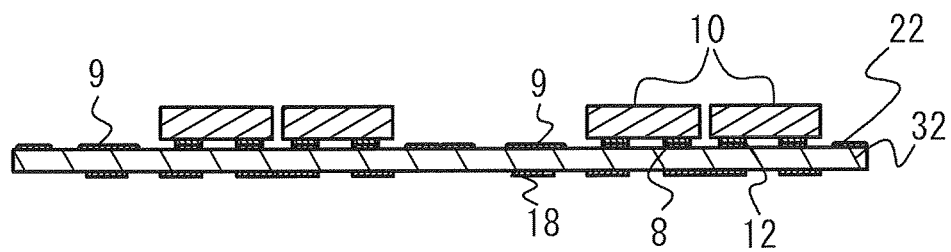
FIGS. 7A through 7D are cross-sectional views illustrating a method for manufacturing the electronic component module in accordance with the third embodiment.

As illustrated in FIG. 7A, the SAW device chips 10 are flip-chip mounted on the upper surface of the insulative substrate 32.

Figure 7B:
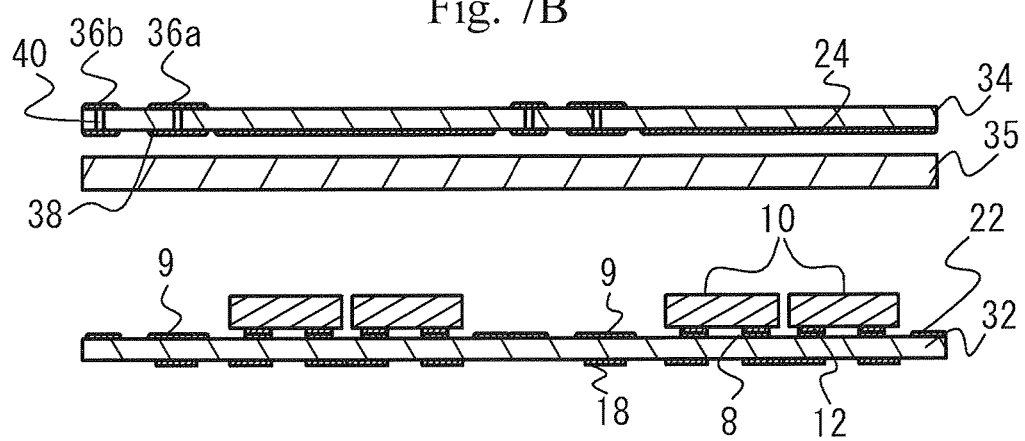

As illustrated in FIG. 7B, the solder sheet 35 and the lid 34 are mounted on the insulative substrate 32 and the SAW device chips 10.

Figure 7C:
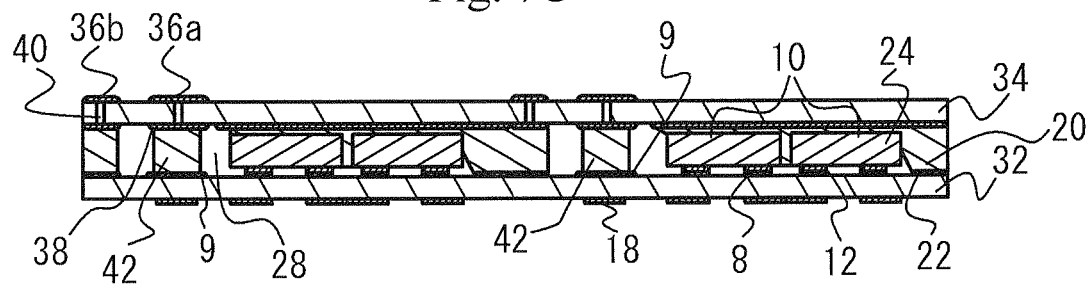

As illustrated in FIG. 7C, the solder sheet 35 is heated and pressurized so that the first metal pattern 22 and the second metal pattern 24 can be joined. In this process, the cavity 28 is defined in a region that is located between the insulative substrate 32 and the lid 16 and is not provided with the first metal pattern 22 and the second metal pattern 24 and is further formed between the insulative substrate 32 and the SAW device chips 10. The interconnections 42 that connect the electrodes 38 and the electrodes 9 are provided in the cavity 28.

Figure 7D:
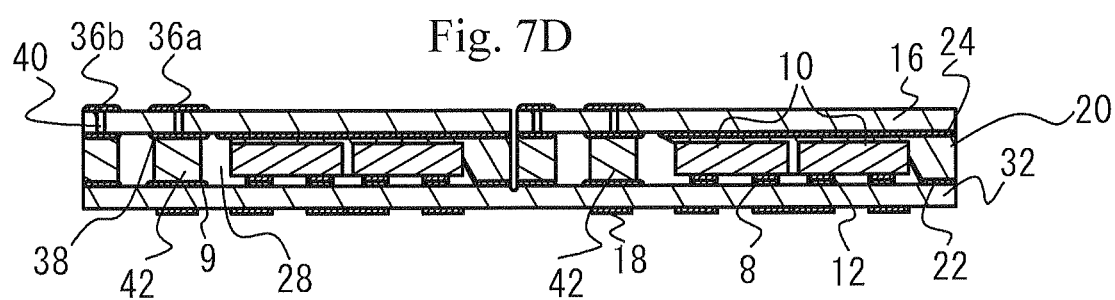

As illustrated in FIG. 7D, the lid 16 and the seal solder 20 are cut by dicing.

Figure 8A:
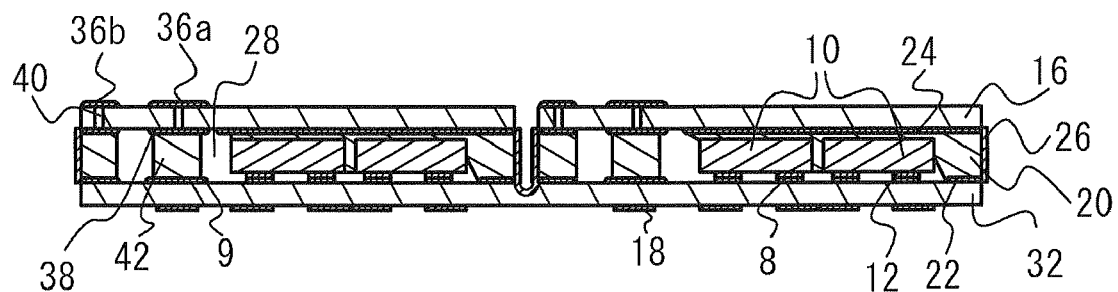
FIGS. 8A and 8B are cross-sectional views illustrating a method for manufacturing the electronic component module in accordance with the third embodiment, in which the processes in FIGS. 8A and 8B follow the processes illustrated in FIGS. 7A through 7D.

As illustrated in FIG. 8A, the metal film 26 made of a metal such as Ni is formed on the seal solder 20 by electroless plating or electrolytic plating.

Figure 8B:
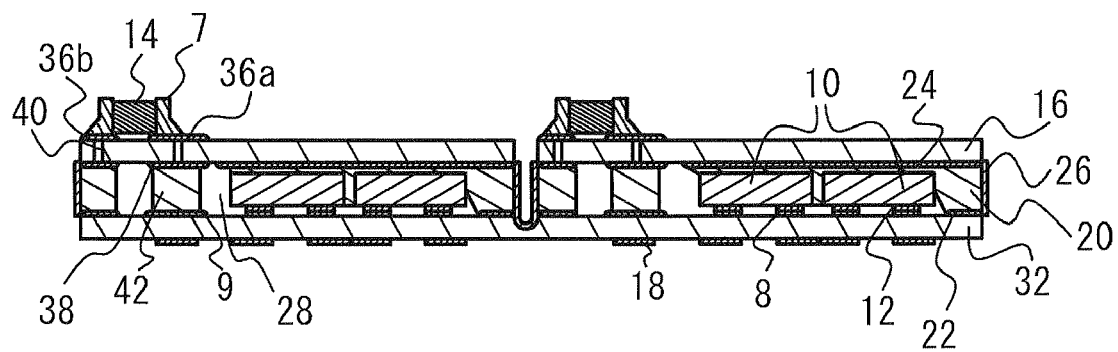

As illustrated in FIG. 8B, the solder 7 is formed on the upper surface of the lid 16 by printing, and the chip components 14 are connected to the electrodes 36a and 36b. That is, the chip components 14 are mounted on the upper surface of the lid 16 by the surface mounting technique.

According to the third embodiment, there is no need to secure a space for mounting the chip component 14 in the insulative substrate 2. It is thus possible to reduce the size (area) of the electronic component module. The interconnections 42 are provided in the cavity 28, and are thus isolated from the seal solder 20 and the SAW device chips 10. Thus, the SAW device chips 10 and the chip component 14 are isolated from each other. It is thus possible to operate the SAW device chips 10 and the chip component 14 separately. According to the third embodiment, it is possible to provide the downsized, highly hermetic electronic component module. As illustrated in FIG. 7D, the interconnection 42 and the seal solder 20 are simultaneously formed from the solder sheet 35, and the manufacturing process may be simplified.

Figure 9:
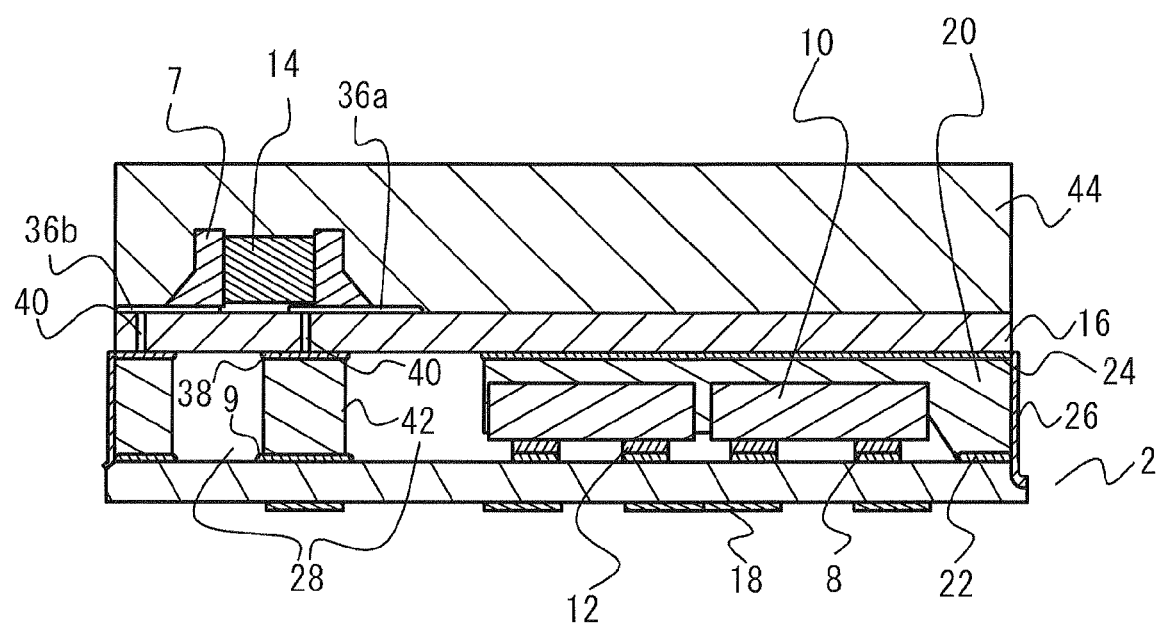
FIG. 9 is a cross-sectional view of a variation of the electronic component device of the third embodiment.

FIG. 9 is a cross-sectional view of a variation of the third embodiment. As illustrated in FIG. 9, the chip component 14 is sealed with a resin 44, which may be epoxy resin. With this structure, the chip component 14 mounted on the upper surface of the lid 16 can be projected.

Fourth Embodiment

Figure 10A:
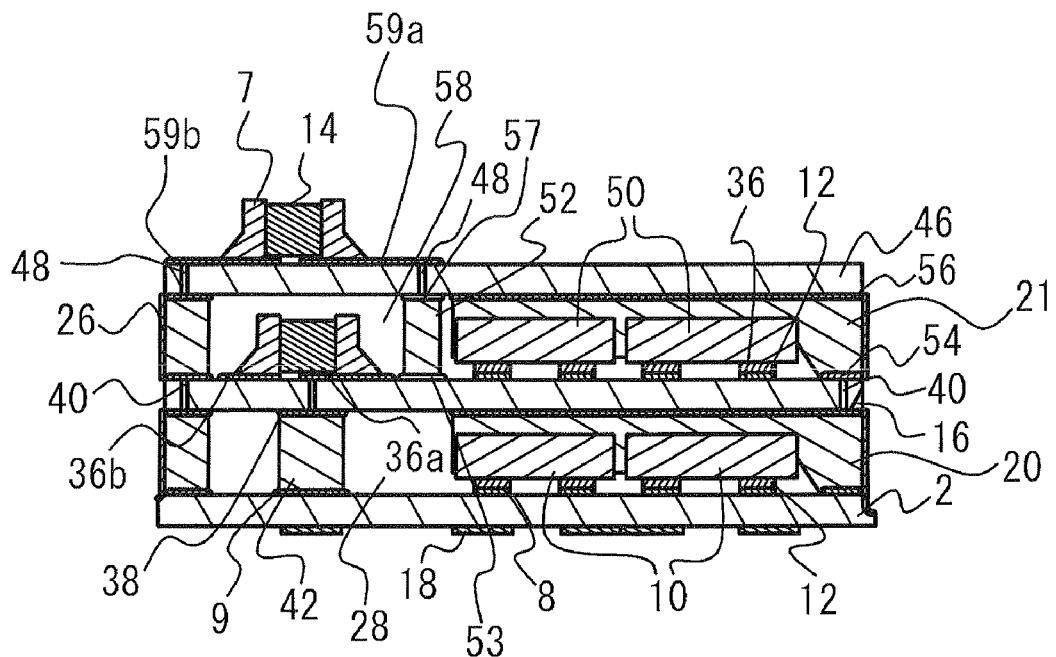
FIGS. 10A and 10B are cross-sectional views of an electronic component module in accordance with a fourth embodiment.
Figure 10B:
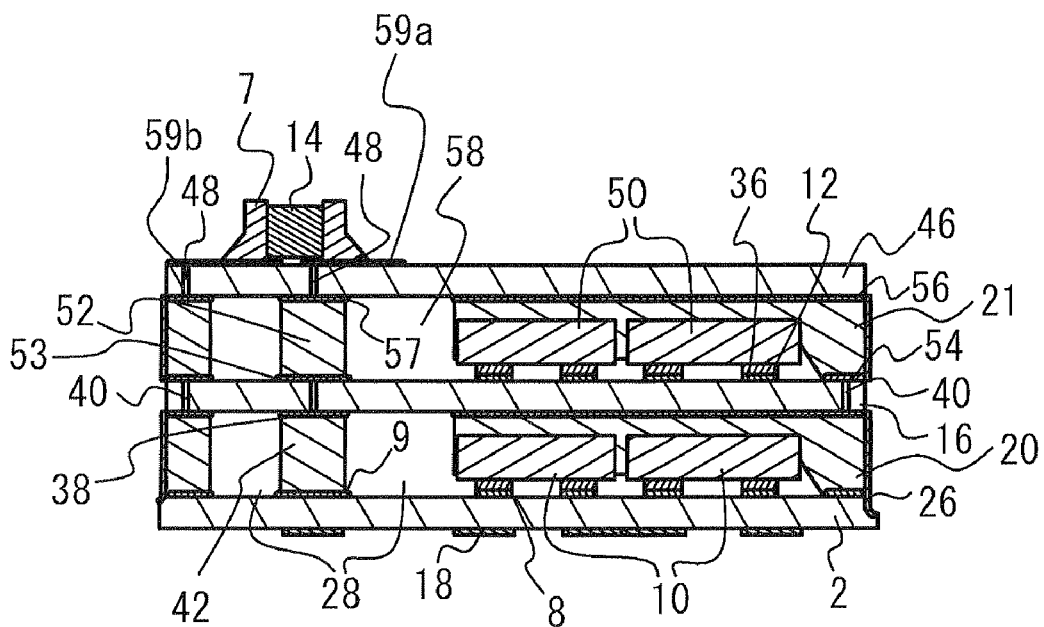

A fourth embodiment is an exemplary structure of the electronic component module having an improved mounting density. FIGS. 10A and 10B are respectively cross-sectional views of electronic component modules in accordance with the fourth embodiment.

Referring to FIG. 10A, two SAW device chips 50 (separate from the device chips 10) are connected to electrodes 36 provided on the upper surface of the lid 16 by bumps 12. In other words, the two SAW device chips 50 are flip-chip mounted on the upper surface of the lid 16. A third metal pattern 54 is formed in edge portions on the upper surface of the lid 16 so as to surround the upper surface of the lid 16. There is another lid 46 having a lower surface on which a fourth metal pattern 56 is provided so as to extend along the edges of the lid 46 and to surround the lower surface of the lid 46 and overlap the SAW device chips 50. The third metal pattern 54 and the fourth metal pattern 56 may be made of a metal such as Au, like the first metal pattern 22 and the second metal pattern 24. Seal solder 21 separate from the seal solder 20 joins the third metal pattern 54 and the fourth metal pattern 56. That is, the chip component 14 and the SAW device chips 50 are sealed with lid 46 and the seal solder 21. Thus, cavity 58 is defined in a region that is located between the lid 16 and the lid 46 and is not provided with the third metal pattern 54 and the fourth metal pattern 56, and is further defined between the lid 16 and the SAW device chips 50. The third metal pattern 54 and the second metal pattern 24 are connected together by the vias 40, and the electrodes 36b and 38 are connected together by the vias 40.

The chip component 14 is connected to electrodes 59a and 59b provided on the upper surface of the lid 46 by solder 7. That is, the chip component is mounted on the upper surface of the lid 46. The electrode 59a and an electrode 57 provided on the lower surface of the lid 46 are connected by vias 48. The electrode 57 and an electrode 53 provided on the upper surface of the lid 16 are connected by an interconnection 52 provided in the cavity 58. That is, the chip component 14 is connected to the lid 16. The electrode 59b and the fourth metal pattern 56 are connected together by the vias 40. That is, the electrode 59b is grounded.

As illustrated in FIG. 10B, the chip component 14 is not mounted on the upper surface of the lid 16, but is mounted on only the lid 46.

According to the fourth embodiment, the chip component 14 and the SAW device chips 50 are mounted on the upper surface of the lid 16, and are sealed with the seal solder 21 and the lid 46. The interconnection 52 is provided in the cavity 58. That is, the two chip components 14 and the SAW device chips 50 are isolated from each other and are capable of operating separately. It is thus possible to provide the electronic component module having an improved integration density and improved hermetic seal.

Although the above-described embodiments employ two SAW devices, only one SAW device chip or three or more SAW device chips may be mounted in the module. Besides the SAW device chips, the module may include a surface acoustic device chip or any type of device chip such as a switch or amplifier.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:

1. An electronic component module comprising:
   an insulative substrate;
   a device chip mounted on a first surface of the insulative substrate in flip-chip mounting;
   a chip component connected to the insulative substrate;
   a lid provided above the insulative substrate and the device chip;
   a first metal pattern that is provided in edge portions on the first surface of the insulative substrate so as to surround the first surface of the insulative substrate;
   a second metal pattern that is provided in edge portions on a second surface of the lid opposite to the first surface so as to surround the second surface; and
   seal solder joining the first and second metal patterns and sealing the device chip so as to define a cavity that is formed in a region that is located between the insulative substrate and the lid and is not provided with the first and second metal patterns and is further formed between the insulative substrate and the device chip,
   wherein the second metal pattern is provided so as to overlap the device chip and so as not to overlap the chip component, and the seal solder joins the first and second metal patterns so as to touch an upper surface of the device chip, the chip component is surrounded by the cavity.

2. The electronic component module according to claim 1, wherein the chip component is mounted on the first surface of the insulative substrate, and the cavity is formed between the chip component and the device chip and is formed between the chip component and the seal solder.

3. The electronic component module according to claim 1, wherein the chip component is mounted directly on a surface of the lid opposite to another surface that faces the insulative substrate, and the chip component is connected to the insulative substrate by a via formed in the lid and an interconnection formed in the cavity.

4. The electronic component module according to claim 1, further comprising a shield pattern provided to the lid.

5. The electronic component module according to claim 1, further comprising another device chip that is flip-chip mounted on the insulative substrate.

6. The electronic component module according to claim 1, wherein the device chip is an acoustic wave device chip.

7. The electronic component module according to claim 1, wherein the seal solder hermetically seals the device chip.

8. The electronic component module according to claim 1, wherein the seal solder is continuously formed and surrounds the device chip.

9. An electronic component module comprising:
   an insulative substrate;
   a device chip mounted on a first surface of the insulative substrate in flip-chip mounting;
   a chip component connected to the insulative substrate;
   a lid provided above the insulative substrate and the device chip;
   a first metal pattern that is provided in edge portions on the first surface of the insulative substrate so as to surround the first surface of the insulative substrate;
   a second metal pattern that is provided in edge portions on a second surface of the lid opposite to the first surface so as to surround the second surface;
   seal solder joining the first and second metal patterns so as to define a cavity that is formed in a region that is located between the insulative substrate and the lid and is not provided with the first and second metal patterns and is further formed between the insulative substrate and the device chip, another device chip that is flip-chip mounted on a surface of the lid opposite to another surface thereof that faces the insulative substrate;

another lid provided on the another device chip;

a third metal pattern that is provided in edge portions on the surface of the lid opposite to another surface thereof facing the insulative substrate so as to surround said surface of the lid;

a fourth metal pattern that is provided in edge portions on a surface of the another lid opposite to another surface thereof facing the lid so as to surround said surface of the another lid; and another seal solder joining the third and fourth metal patterns so as to define another cavity that is formed in a region that is located between the lid and the another lid and is not provided with the third and fourth metal patterns and is further formed between the lid and the another device chip.

10. A method for manufacturing an electronic component module comprising:

mounting a device chip on a first surface of an insulative substrate in flip-chip mounting;

connecting the insulative substrate and a chip component; and sealing the device chip by joining, with seal solder, a first metal pattern that is provided in edge portions on the first surface of the insulative substrate so as to surround the first surface of the insulative substrate, and a second metal pattern that is provided in edge portions on a second surface of the lid opposite to the first surface so as to surround the second surface and overlap the device chip and so as not to overlap the chip component, so as to define a cavity that is formed in a region that is located between the insulative substrate and the lid and is not provided with the first and second metal patterns and is further formed between the insulative substrate and the device chip, wherein the seal solder joins the first and second metal patterns so as to touch an upper surface of the device chip, the chip component is surrounded by the cavity.

11. The method according to claim 10, wherein the connecting includes mounting the chip component on the upper surface of the insulative substrate so as to define the cavity formed between the chip component and the device chip and between the chip component and the seal solder.

12. The method according to claim 10, wherein the connecting includes mounting the chip component on a surface of the lid opposite to another surface thereof facing the insulative substrate, and connecting the chip component to the insulative substrate by a via formed in the lid and an interconnection formed in the cavity.

13. The method according to claim 10, wherein the joining includes arranging a solder sheet between the insulative substrate and the lid, and heating pressurizing the solder sheet.

* * * * *